(12) United States Patent
Cho

(10) Patent No.: US 9,111,689 B2
(45) Date of Patent: Aug. 18, 2015

(54) VERTICAL INTERDIGITATED SEMICONDUCTOR CAPACITOR

(75) Inventor: Hsiu-Ying Cho, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1097 days.

(21) Appl. No.: 13/158,044

(22) Filed: Jun. 10, 2011

(65) Prior Publication Data

US 2011/0254132 A1    Oct. 20, 2011

(51) Int. Cl.
*G01R 31/28* (2006.01)
*H01G 4/232* (2006.01)
*H01G 4/30* (2006.01)
*H01G 4/33* (2006.01)
*H01L 23/522* (2006.01)
*H01L 49/02* (2006.01)

(52) U.S. Cl.
CPC ............... *H01G 4/232* (2013.01); *H01G 4/30* (2013.01); *H01G 4/33* (2013.01); *H01L 23/5223* (2013.01); *H01L 28/86* (2013.01); *H01L 28/90* (2013.01); *H01L 2924/0002* (2013.01)

(58) Field of Classification Search
CPC ............ H01G 4/232; H01L 23/5223; H01L 2924/0002
USPC ......... 324/762.1, 600, 548, 661, 500, 763.01, 324/763.02, 754.07, 750.3, 750.15, 324/754.01–754.03; 257/48, 207, 210–211; 438/660, 14, 597, 612, 18
See application file for complete search history.

(56) References Cited

U.S. PATENT DOCUMENTS

| | | | |
|---|---|---|---|
| 5,894,402 A * | 4/1999 | Strange et al. | 361/514 |
| 6,383,858 B1 | 5/2002 | Gupta et al. | |
| 6,743,671 B2 | 6/2004 | Hu et al. | |
| 7,485,912 B2 | 2/2009 | Wang | |
| 8,049,331 B2 * | 11/2011 | Neaves | 257/725 |
| 2004/0147961 A1* | 7/2004 | O'Phelan et al. | 607/1 |
| 2010/0141354 A1 | 6/2010 | Cho | |
| 2010/0214041 A1 | 8/2010 | Cho | |

(Continued)

OTHER PUBLICATIONS

Unpublished U.S. Appl. No. 13/411,052, filed Mar. 2, 2012 entitled "Structure and Method for a Fishbone Differential Capacitor," 38 pages.

(Continued)

*Primary Examiner* — Jermele M Hollington
*Assistant Examiner* — Trung Nguyen
(74) *Attorney, Agent, or Firm* — Haynes and Boone, LLP

(57) ABSTRACT

The present disclosure provides a semiconductor device. The semiconductor device includes a substrate that spans in an X-direction and a Y-direction that is orthogonal to the X-direction. The semiconductor device includes an interconnect structure formed over the substrate in a Z-direction that is orthogonal to both the X-direction and the Y-direction. The interconnect structure includes a plurality of metal lines interconnected together in the Z-direction by a plurality of vias. The interconnect structure contains a capacitor that includes an anode component and a cathode component. The anode component includes an array of elongate anode stack elements extending in the Z-direction. The cathode component includes an array of elongate cathode stack elements extending in the Z-direction. The array of anode stack elements are interdigitated with the array of cathode stack elements in both the X direction and the Y direction.

20 Claims, 12 Drawing Sheets

(56) References Cited

U.S. PATENT DOCUMENTS

2010/0244186 A1* 9/2010 Katsumata et al. ............ 257/530
2011/0254576 A1* 10/2011 Cho ........................ 324/756.01

OTHER PUBLICATIONS

Unpublished U.S. Appl. No. 13/272,866, filed Oct. 13, 2011 entitled "Vertically Oriented Semiconductor Device and Shielding Structure Thereof," 38 pages.

Unpublished U.S. Appl. No. 13/212,982, filed Aug. 20, 2011 entitled "Vertically Oriented Semiconductor Device and Shielding Structure Thereof," 44 pages.

Unpublished U.S. Appl. No. 13/280,786, filed Oct. 25, 2011 entitled "Structure and Method for a High-K Transformer with Capacitive Coupling," 39 pages.

Unpublished U.S. Appl. No. 13/227,242, filed Sep. 7, 2011 entitled "A Horizontal Interdigitated Capacitor Structure with Vias," 44 pages.

Kawano, Yoichi, et al., "A 77GHz Transceiver in 90nm CMOS," 2009 IEEE International Solid-State Circuits Conference, 978-1-4244-3457-2/09, ISSCC 2009/Session 18/Ranging and Gb/s Communication/18.3, 3 pages.

Lim, Chee Chong, et al., "Fully Symmetrical Monolithic Transformer (True 1:1) for Silicon RFIC," IEEE Transactions on Microwave Theory and Techniques, vol. 56, No. 10, Oct. 2008, pp. 2301-2311.

Unpublished U.S. Appl. No. 13/212,987, filed Aug. 18, 2011 entitled "Vertically Oriented Semiconductor Device and Shielding Structure Thereof," 45 pages.

Unpublished U.S. Appl. No. 13/212,976, filed Aug. 18, 2011 entitled "Vertically Oriented Semiconductor Device and Shielding Structure Thereof," 44 pages.

* cited by examiner

VERTICAL INTERDIGITATED SEMICONDUCTOR CAPACITOR

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

Various active or passive electronic components can be formed on a semiconductor IC. For example, a semiconductor capacitor may be formed as a passive electronic component. Traditionally, a semiconductor capacitor may have a metal-on-metal (MOM) structure. As device sizes continue to decrease, the MOM structure for traditional semiconductor capacitors may encounter problems such as excessive area consumption, low capacitance density, and/or high fabrication costs.

Therefore, while existing semiconductor capacitor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
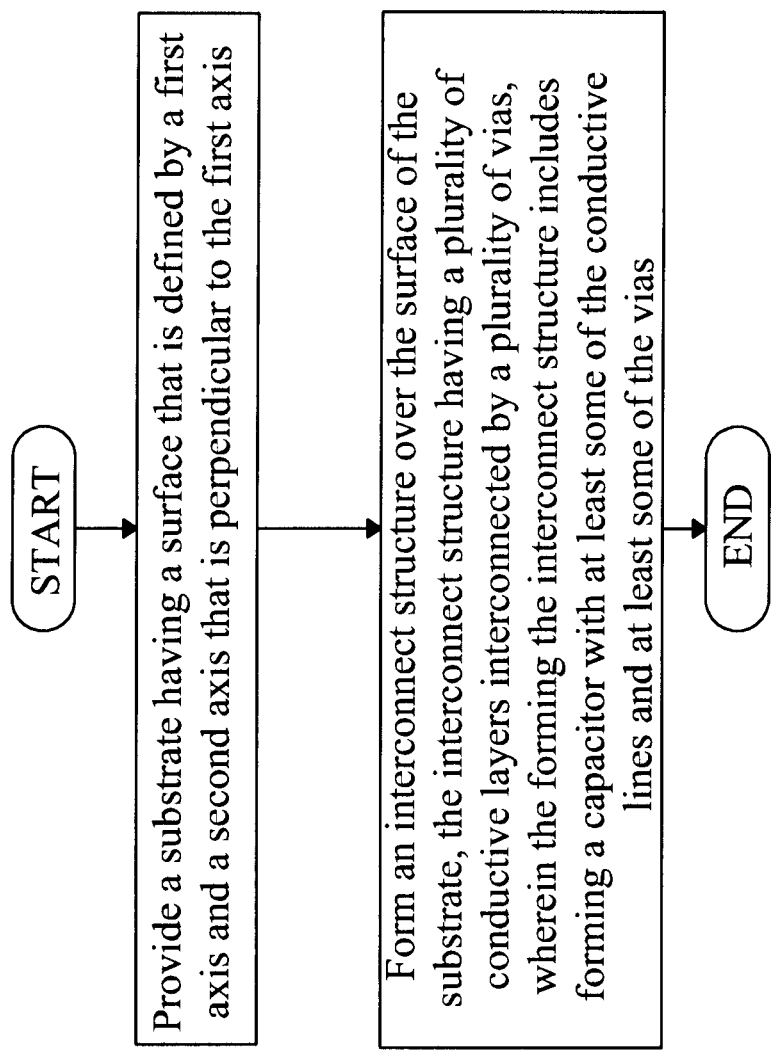
FIG. 1 is a flowchart illustrating a method of fabricating a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a flowchart of a method 20 for fabricating a semiconductor device that includes a capacitor structure. The semiconductor device may include an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that the Figures discussed herein have been simplified for a better understanding of the inventive concepts of the present disclosure. Accordingly, it should be noted that additional processes may be provided before, during, and after the method 20 of FIG. 1, and that some other processes may only be briefly described herein.

Referring to FIG. 1, the method 20 begins with block 25 in which a substrate is provided. The substrate has a surface that is defined by a first axis and a second axis that is perpendicular to the first axis. The method 20 begins with block 30 in which an interconnect structure is formed over the surface of the substrate. The interconnect structure includes a plurality of conductive lines interconnected by a plurality of vias. The interconnect structure is formed in a manner such that a capacitor is formed in the interconnect structure. The capacitor is formed with at least some of the conductive lines and at least some of the vias of the interconnect structure. The capacitor is formed to have an anode component and a cathode component. The anode component includes a plurality of first conductive stacks. The cathode component includes a plurality of second conductive stacks. The first conductive stacks and the second conductive stacks each extend along a third axis that is perpendicular to the surface of the substrate. The first and second conductive stacks are formed to be interdigitated with one another along both the first axis and the second axis. In an embodiment, each conductive stack includes an elongate stack that extends along the third axis. Each elongate stack includes a plurality of vias and a plurality of metal lines aligned with each other and interconnected together by the plurality of vias.

Figure 2:
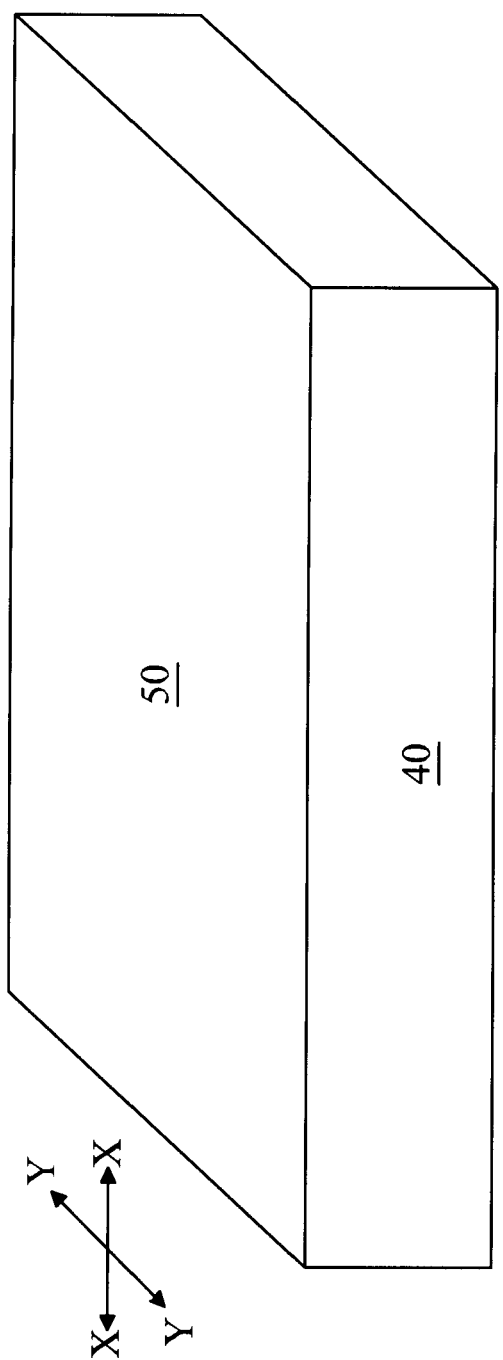
FIGS. 2-3 are cross-sectional views of a semiconductor device at different stages of fabrication.
Figure 3:
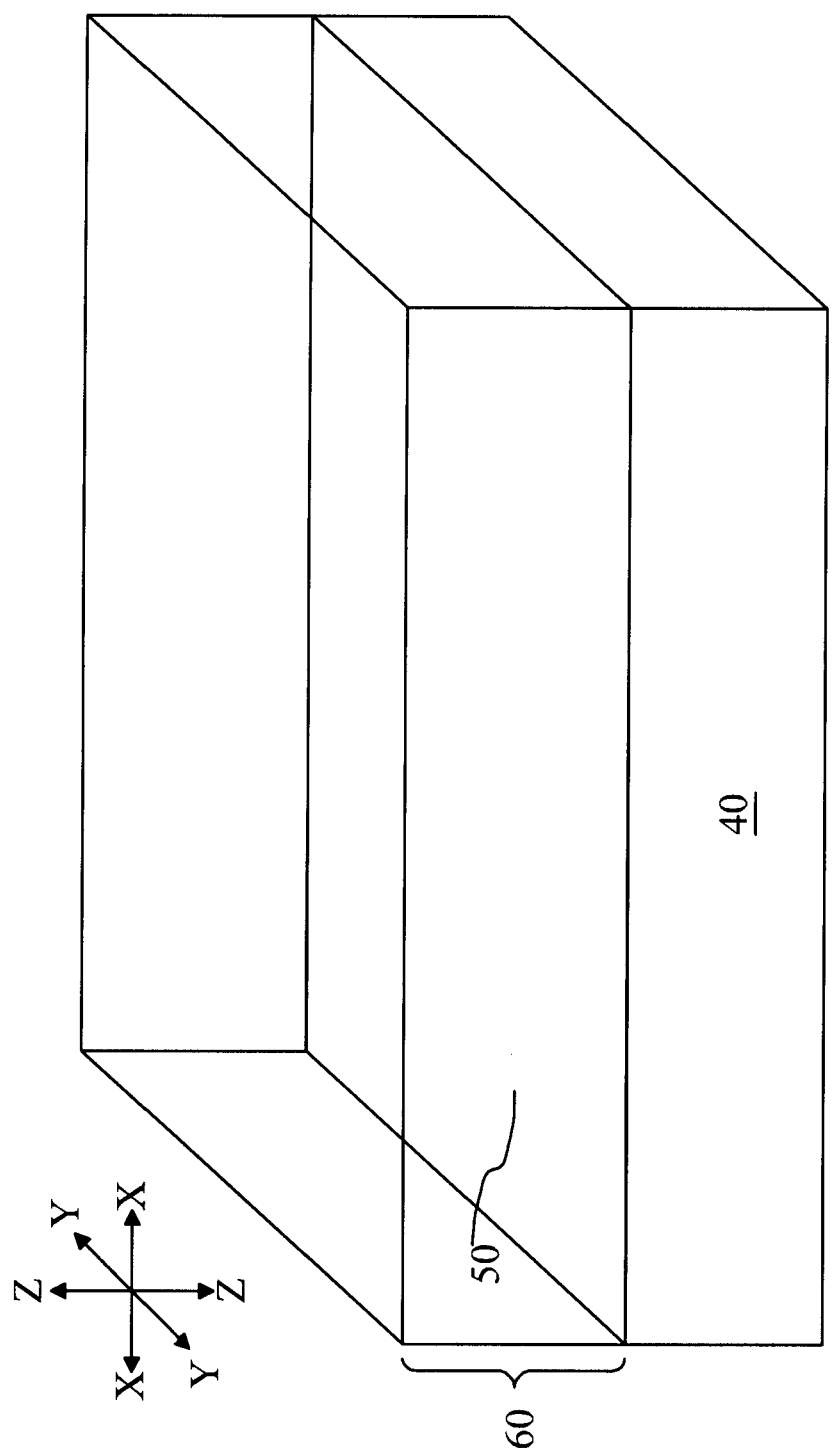

FIGS. 2 and 3 are diagrammatic fragmentary cross-sectional side views of a semiconductor device fabricated according to the various aspects of the present disclosure. Referring to FIG. 2, a semiconductor device is fabricated in accordance with the method 20 of FIG. 1. The semiconductor device has a substrate 40. In one embodiment, the substrate 40 is a silicon substrate doped with either a P-type dopant such as boron, or doped with an N-type dopant such as arsenic or phosphorous. The substrate 40 may be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 40 could include an epitaxial layer (epi layer), may be strained for performance enhancement, and may include a silicon-on-insulator (SOI) structure.

Although not specifically shown for the sake of simplicity, a plurality of electronic components may be formed in the substrate. For example, source and drain regions of FET transistor devices may be formed in the substrate. The source and drain regions may be formed by one or more ion implantation or diffusion processes. As another example, isolation structures such as shallow trench isolation (STI) structures or deep trench isolation (DTI) structures may be formed in the substrate to provide isolation for the various electronic components. These isolation structures may be formed by etching recesses (or trenches) in the substrate 40 and thereafter filling the recesses with a dielectric material, such as silicon oxide, silicon nitride, silicon oxy-nitride, fluoride-doped silicate (FSG), and/or a low-k dielectric material known in the art.

The substrate 40 has an upper surface 50. The surface 50 is a two-dimensional plane that is defined by an X-axis and a Y-axis, where the X-axis and Y-axis are perpendicular, or orthogonal, to each other. The X-axis and the Y-axis may also be referred to as an X-direction and a Y-direction, respectively.

Referring now to FIG. 3, an interconnect structure 60 is formed over the upper surface 50 of the substrate 40. In other words, the interconnect structure 60 is disposed over the surface 50 in a Z-axis, or a Z-direction that is perpendicular to the surface 50. The interconnect structure 60 includes a plurality of patterned dielectric layers and interconnected conductive layers. These interconnected conductive layers provide interconnections (e.g., wiring) between circuitries, inputs/outputs, and various doped features formed in the substrate 40. In more detail, the interconnect structure 60 may include a plurality of interconnect layers, also referred to as metal layers (e.g., M1, M2, M3, etc). Each of the interconnect layers includes a plurality of interconnect features, also referred to as metal lines. The metal lines may be aluminum interconnect lines or copper interconnect lines, and may include conductive materials such as aluminum, copper, aluminum alloy, copper alloy, aluminum/silicon/copper alloy, titanium, titanium nitride, tantalum, tantalum nitride, tungsten, polysilicon, metal silicide, or combinations thereof. The metal lines may be formed by a process including physical vapor deposition (PVD), chemical vapor deposition (CVD), sputtering, plating, or combinations thereof.

The interconnect structure 60 includes an interlayer dielectric (ILD) that provides isolation between the interconnect layers. The ILD may include a dielectric material such as an oxide material. The interconnect structure 60 also includes a plurality of vias/contacts that provide electrical connections between the different interconnect layers and/or the features on the substrate. For the sake of simplicity, the metal lines in the interconnect layers, the vias interconnecting the metal lines, and the dielectric material separating them are not specifically illustrated herein.

According to various aspects of the present disclosure, an interdigitated capacitor structure is formed in the interconnect structure 60. Or stated differently, various components of the interconnect structure 60 constitute the interdigitated capacitor disclosed herein. The capacitor structure is not shown in FIG. 3 for the sake of simplicity, but its various embodiments are illustrated in more detail in FIGS. 4 and 8-10 and will be discussed in more detail by the following paragraphs.

Figure 4:
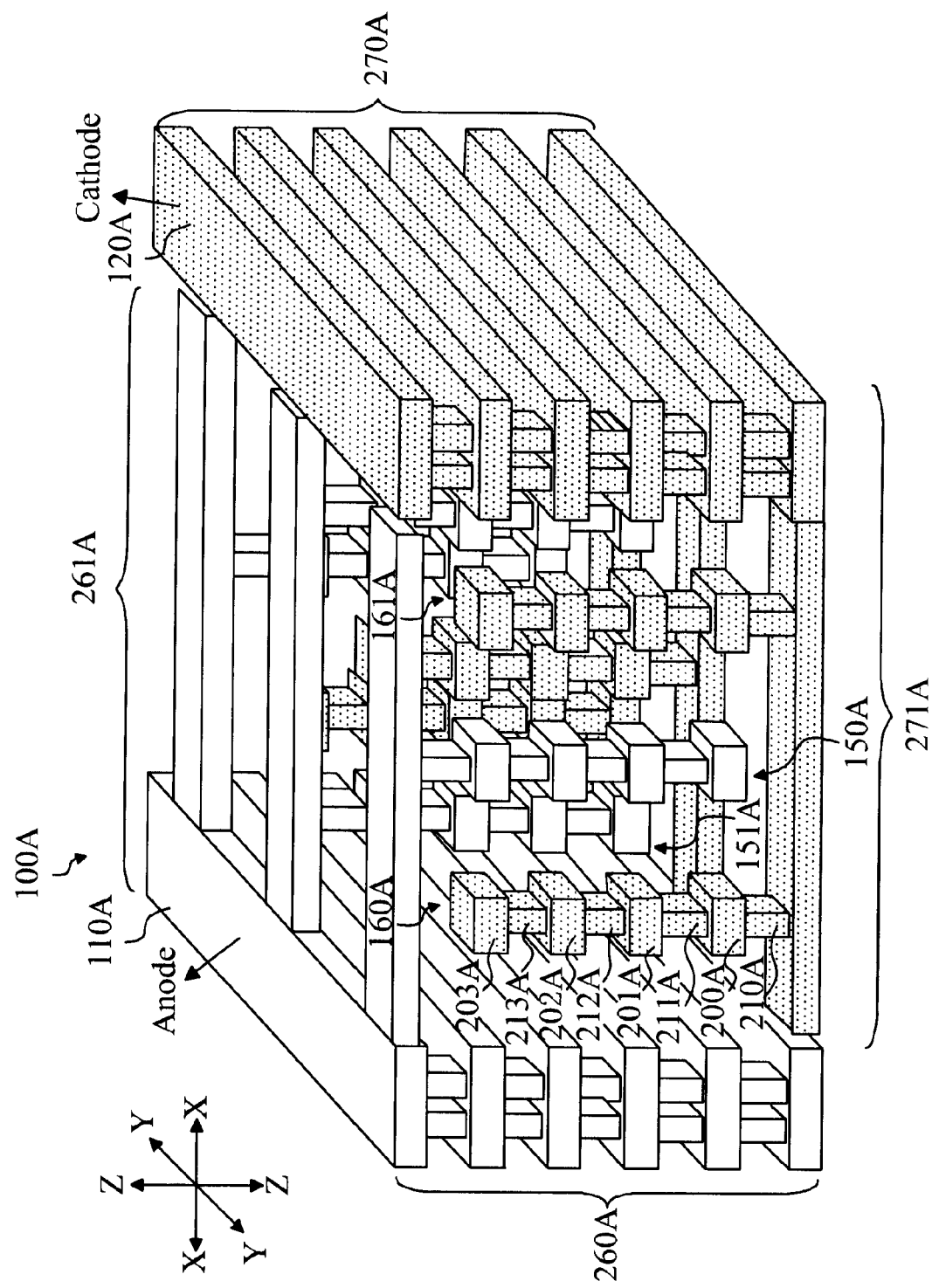
FIG. 4 is a perspective view of a semiconductor capacitor.

Referring now to FIG. 4, a fragmentary (partial) perspective view of an embodiment of the interdigitated capacitor structure 100A is illustrated according to aspects of the present disclosure. The capacitor structure 100A includes an anode component 110 and a cathode component 120A. The anode component 110A and the cathode component 120A respectively serve as anode and cathode terminals of the capacitor structure 100A, so that an electrical voltage can be applied through the anode and cathode terminals. Stated differently, when the capacitor structure 100A is in operation (functioning as a capacitor), one voltage will be applied throughout the anode component 110A, while a different voltage will be applied throughout the cathode component 120A. The anode and cathode components 110A and 120A may be considered opposite electrodes or may be said to have different polarities. It is also understood that the relative positioning of the anode and cathode components 110A and 120A is not critical. For example, the anode and cathode components 110A and 120A may be rotated, flipped, or switched in other embodiments.

It is also understood that the dielectric material of the interconnect structure 60 serves as the dielectric between the anode and cathode electrodes of the capacitor structure 100A. In FIG. 4, the dielectric material separates and electrically isolates the various parts of the anode component 110A from the various parts of the cathode component 120A. Depending on the need and function to be performed by the capacitor structure 100A, the dielectric material of the interconnect structure 100A can be carefully chosen so as to effect the desired capacitance. For example, the capacitance for a parallel plate capacitor can be calculated with the following equation:

$$C = \varepsilon_r \varepsilon_0 \frac{A}{d}$$

where C is the capacitance; A is the area of overlap of the two plates; $\varepsilon_r$ is the dielectric constant of the material between the plates; $\varepsilon_0$ is the electric constant ($\varepsilon_0 \approx 8.854 \times 10\text{-}12$ F m$^{-1}$); and d is the separation between the plates. As such, if a high capacitance capacitor is desired, the dielectric material of the interconnect structure can be chosen to have a high dielectric constant.

The anode component 110A and the cathode component 120A each include a plurality of (or arrays of) conductive stacks. Two of such conductive stacks of the anode component 110A are labeled herein as conductive stacks 150A and 151A, and two of such conductive stacks of the cathode component 120A are labeled herein as conductive stacks 160A and 161A. According to various aspects of the present disclosure, these conductive stacks 150A-151A and 160A-161A each include a plurality of conductive components and a plurality of vias that interconnect the conductive components. Using the conductive stack 160A as an example, it includes conductive components 200A, 201A, 202A, and 203A, as well as vias 210A, 211A, 212A, and 213A.

In an embodiment, the conductive components 200A-203A are a subset of metal lines belonging to different interconnect layers (or metal layers) of the interconnect structure 60 of FIG. 3. For example, the conductive component 200A may be a metal line in a Metal-2 layer, the conductive component 201A may be a metal line in a Metal-3 layer, the conductive component 202A may be a metal line in a Metal-4 layer, and the conductive component 203A may be a metal line in a Metal-5 layer. Thus, it is understood that the term "conductive components" and "metal lines" may be used interchangeably hereinafter to refer to the conductive components on different layers of the conductive stacks. The vias 210A-213A are the vias that interconnect these metal lines together.

In the embodiment shown in FIG. 4, the metal lines 200A-203A and the vias 210A-213A are substantially aligned in a direction along the Z-axis (i.e., the vertical direction that is perpendicular to the surface 50 of the substrate 40 of FIG. 2).

In this manner, the conductive stack 160A resembles an elongate element that vertically extends along the Z-axis. The same is true for the other conductive stacks of the anode component 110A and the cathode component 120A. However, it is understood that alternative configurations may be implemented in other embodiments. For example, the metal lines and the vias of each conductive stack may be interconnected but may not necessarily be vertically aligned.

According to aspects of the present disclosure, each conductive stack is also interdigitated with a conductive stack of the opposite polarity in both the X-direction and the Y-direction (or along the X and Y axes). For example, the conductive stack 160A is disposed immediately adjacent to the conductive stack 150A in the X-direction. The conductive stack 160A is also disposed immediately adjacent to the conductive stack 151A in the Y-direction. Both of the conductive stacks 150A and 151A are elements of the anode component 110A, while the conductive stack 160A is an element of the cathode component 120A. In other words, the conductive stacks 150A and 151A are of one polarity, while the conductive stack 160A is of the opposite polarity.

Figure 5A:
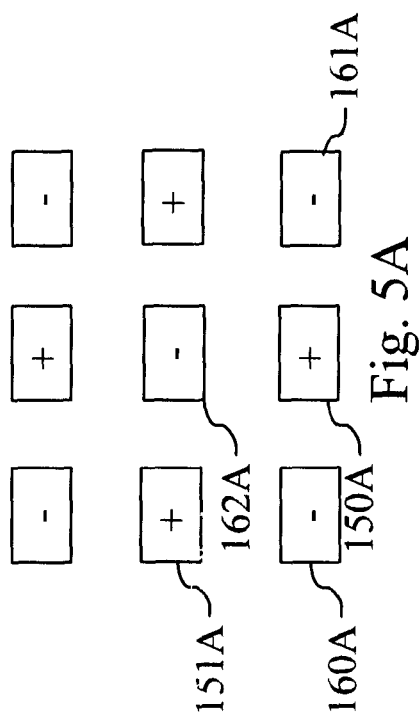
FIGS. 5A and 5B are top and perspective views of a portion of the semiconductor capacitor, respectively.
Figure 5B:
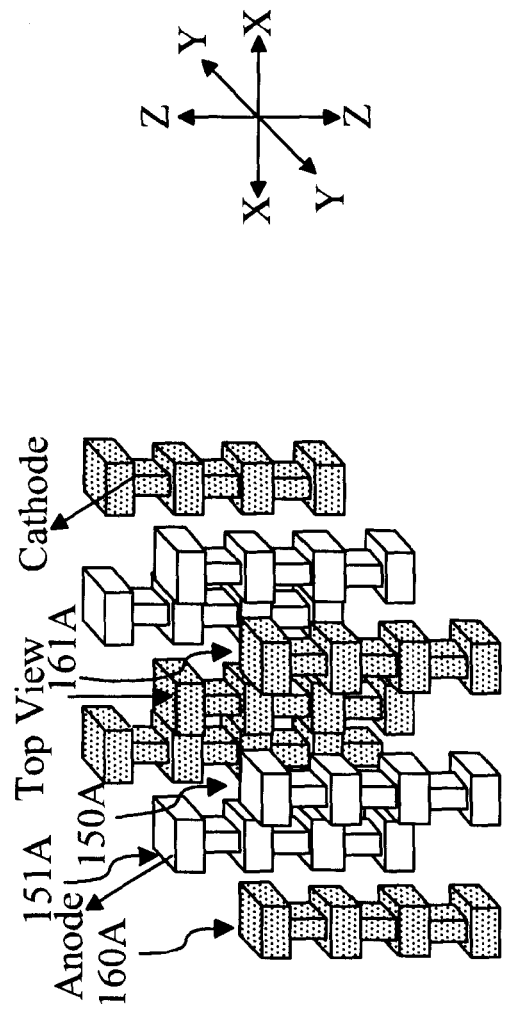

FIGS. 5A and 5B illustrate the above discussions in more detail. Specifically, FIG. 5A is a diagrammatic fragmentary top view of the conductive stacks of the capacitor structure 100A of FIG. 4, and FIG. 5B is a diagrammatic fragmentary perspective view of the conductive stacks of the capacitor structure 100A. As FIGS. 5A and 5B clearly illustrate, the conductive stacks (including the conductive stacks 150A-151A and 160A-161A) of the anode and cathode components are substantially aligned with one another to form a plurality of arrays that span in both the X-direction and the Y-direction. In other words, a two-dimensional array having alternating (or interdigitated) anode and cathode elements can be observed in a top view. For example, as shown by the top view of FIG. 5A, a three-by-three array having nine conductive stacks is formed. In other embodiments, arrays having other number of conductive stacks may be formed instead, such as four-by-four or five-by-seven, etc.

Within the array, each conductive stack is disposed immediately adjacent to another conductive stack of an opposite polarity. In an embodiment, two conductive stacks are considered to be immediately adjacent to each other if they are substantially aligned in either the X-direction or the Y-direction, and if no other conductive stack is disposed between them. Otherwise, two conductive stacks may be non-immediately adjacent (e.g., if they are diagonally aligned) to one another, or may not be adjacent at all (e.g., if they are separated by other conductive stacks therebetween).

For example, as clearly shown by the top view of FIG. 5A, the conductive stack 160A is immediately adjacent to the conductive stack 150A (aligned in the X-direction) and the conductive stack 151A (aligned in the Y-direction). And although no conductive stack(s) separate the conductive 160A and the conductive stack 162A, they are not considered to be immediately adjacent to one another, since they are diagonally disposed and thus not aligned in either the X-direction or the Y-direction. The conductive stack 160A is also not immediately adjacent to the conductive stack 161A, since they are separated by the conductive stack 150A. It is understood, however, that the term "immediately adjacent" may not be defined as strictly in other embodiments. For example, in other embodiments, two neighboring conductive stacks may still be considered to be immediately adjacent to each other even if they are not substantially aligned in either the X-direction or the Y-direction. Stated differently, a suitable offset in either the X or Y directions may be tolerated.

Referring back to FIGS. 5A-5B, according to the various aspects of the present disclosure discussed above, conductive stacks that are disposed immediately adjacent have opposite polarities (i.e., they are complementary). Thus, if a given conductive stack is a part of the anode component, then its immediately adjacent conductive stacks should be a part of the cathode component, and vice versa. This interdigitated configuration helps optimize the capacitance density of the capacitor structure, since the interdigitated anode/cathodes increase the effective area of the capacitor without sacrificing overall chip space. This is at least in part due to the fact that the capacitance of a capacitor is directly correlated with the anode/cathode coupling area (as discussed above), thus increasing this area will help increase the effective capacitance as well. Hence, overall capacitance density may be increased, while the capacitor structure 100A still occupies substantially the same amount of area on the IC chip.

Figures 6A, 6B:
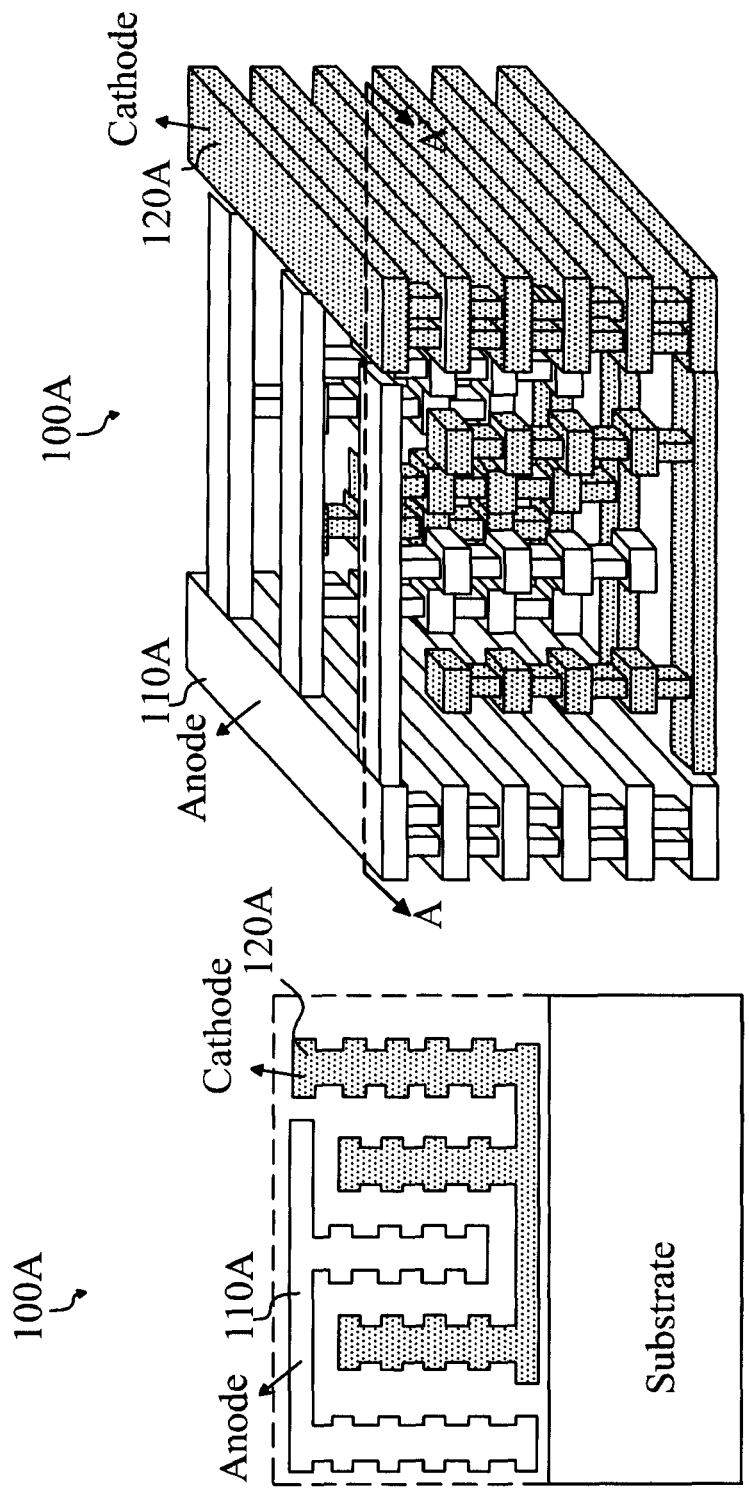
FIGS. 6A and 6B are cross-sectional and perspective views of the semiconductor capacitor, respectively.

The anode/cathode coupling area is also enhanced by an increase in sidewall coupling area of the conductive stacks. This is illustrated in FIGS. 6A-6B, where FIG. 6A is a diagrammatic fragmentary cross-sectional side view of the capacitor structure 100A discussed above, and FIG. 6B is a diagrammatic fragmentary perspective view of the capacitor structure 100A. Specifically, the cross-sectional side view of FIG. 6A is taken across a vertical plane in FIG. 6B from point A to point A', designated with broken lines. As illustrated clearly in FIG. 6A, the metal lines of the conductive stacks have greater lateral areas than the vias that interconnect them. As a result, each conductive stack has a zig-zag cross-sectional sidewall profile. Such zig-zag profile increases the effective coupling area between immediately adjacent conductive stacks.

Figure 7B:
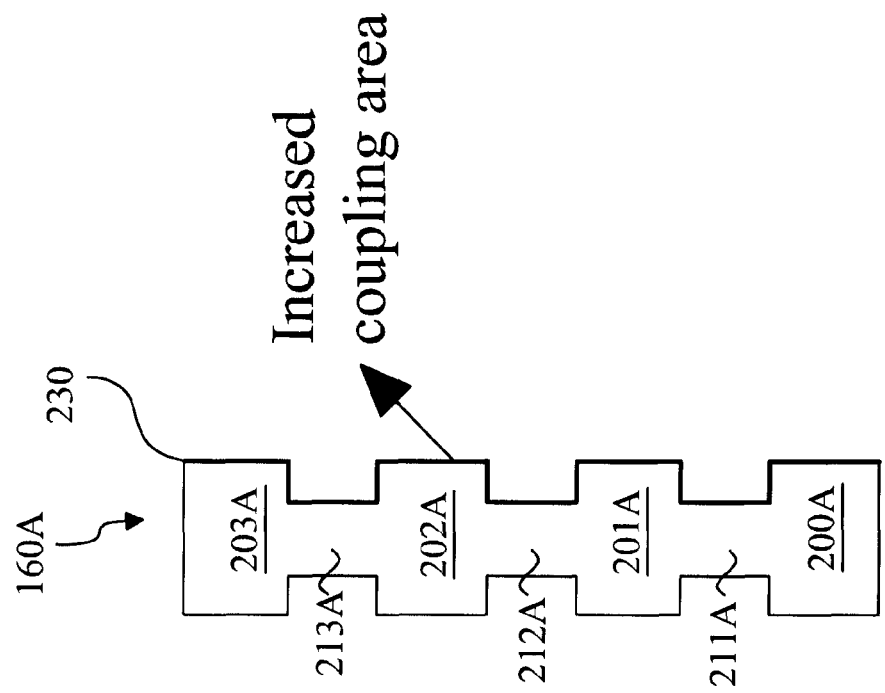
FIGS. 7A and 7B are detailed cross-sectional and perspective views of the semiconductor capacitor, respectively.
Figure 7A:
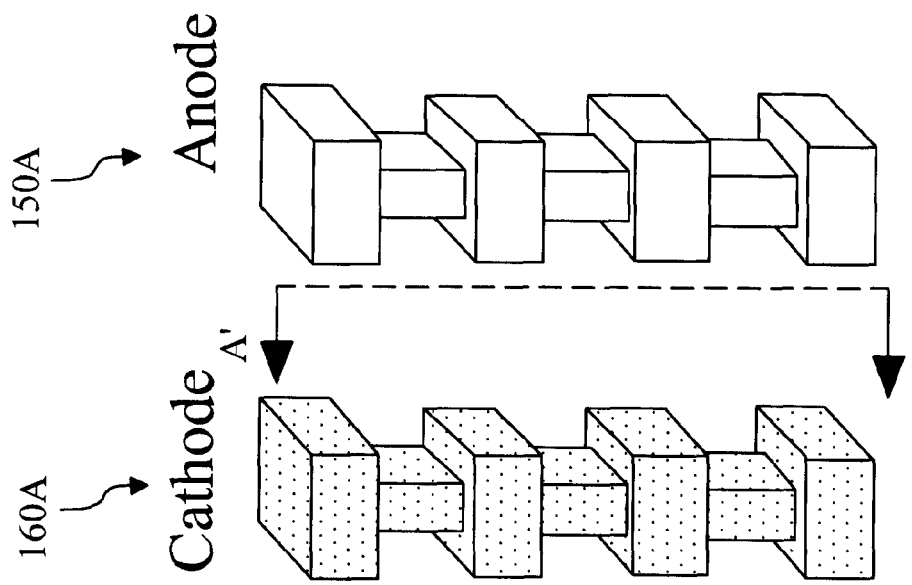

To illustrate the increased sidewall area more clearly, refer to FIGS. 7A and 7B. FIG. 7A is a diagrammatic fragmentary cross-sectional side view of a portion of a conductive stack (e.g., conductive stack 160A of FIG. 4) in more detail, and FIG. 7B is a diagrammatic fragmentary perspective side view of two adjacent conductive stacks (e.g., conductive stacks 160A and 150A) in more detail. Specifically, the cross-sectional side view of FIG. 7A is taken across point A to point A' (designated with broken lines) in FIG. 7B. Hence, FIG. 7A is a detailed view of the sidewall profile of the cathode stack 160A of FIG. 7B.

As discussed above, the metal lines 200A-203A of the conductive stack 160A have greater lateral dimensions than the vias 211A-213A interconnecting them. As a result, the metal lines 200A-203A effectively constitute convex portions (protruding outwards), and the vias 211A-213A effectively constitute concave portions (protruding inwards). These alternating convex and concave portions form a zig-zag line 230. Although not shown in FIG. 7A, a similar zig-zag line is also formed in the anode conductive stack 150A (of FIG. 7B). These two opposing sidewalls having the zig-zag profile have greater effective coupling area therebetween compared to two straight vertical stacks. For these reasons discussed above, the present disclosure offers enhanced capacitance density through interdigitated positioning of opposing (or complementary) electrode stacks having zig-zag shapes.

Referring back to FIG. 4, the anode component 110A also includes a side portion 260A and a top portion 261A, and the cathode component 120A also includes a side portion 270A and a bottom portion 271A. The side portions 260A and 270A each include a plurality of elongate metal lines interconnected vertically (in the Z-direction) by vias, where the elongate metal lines extend in the Y direction. The top and bottom portions 261A and 271A each include a plurality of elongate metal lines (also referred to as "fingers") that extend in the X-direction. The elongate metal lines of the top portion 261A are metal lines in the same metal layer, and the elongate metal lines of the bottom portion 271A are metal lines in the same metal layer (but a different metal layer than the metal lines of the top portion 261A). It is understood that in other embodiments, the anode component 110A may have a bottom portion and the cathode component 120A may have a top portion instead. In other embodiments, the side portions and the top and bottom portions may also have alternative shapes and designs.

Figure 8:
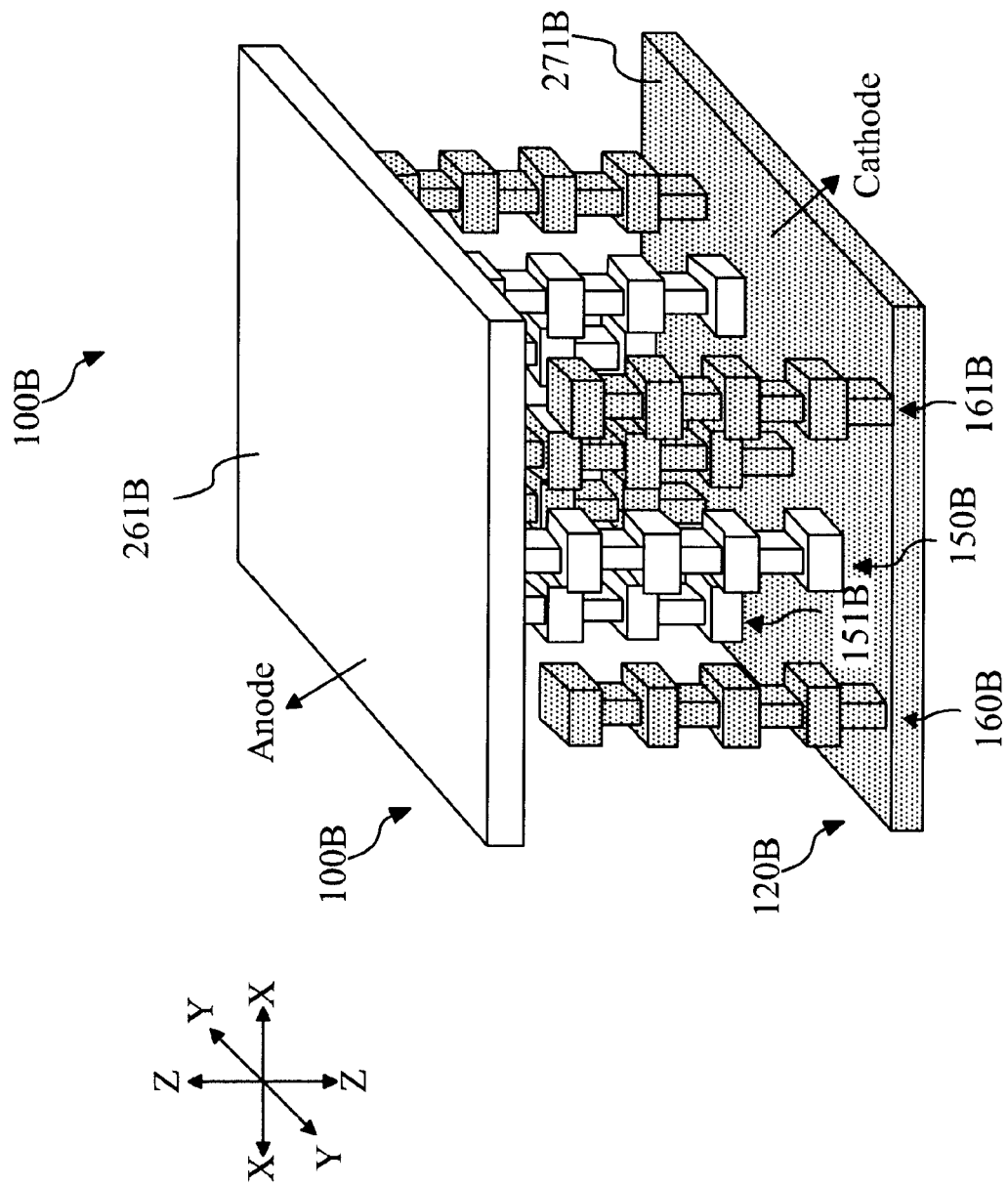
FIGS. 8-12 are perspective views of alternative embodiments of the semiconductor capacitor, respectively.

Referring now to FIG. 8, a diagrammatic fragmentary perspective view of an alternative embodiment of the capacitor structure discussed above is illustrated as capacitor structure 100B. For the sake of clarity and consistency, components that appear in the previous Figures are labeled the same for FIG. 8 and the following Figures. As is illustrated in FIG. 8, the capacitor structure 100B still includes an anode component 110B and a cathode component 120B. The anode and cathode components include arrays conductive stacks that are disposed in an interdigitated manner with conductive stacks having opposite polarities.

The capacitor structure 100B of FIG. 8 does not have side portions similar to those of FIG. 4. In addition, unlike the metal "fingers" in the top and bottom portions of the embodiment of FIG. 4, the embodiment shown in FIG. 8 includes a top portion 261B and a bottom portion 271B that are each a single plate of metal. As such, the top and bottom portions have greater surface areas than those in the embodiment of FIG. 4. The greater surface areas correspond to lower resistance of the capacitor structure 100B. A quality factor (or Q factor) is inversely correlated to the resistance. Thus, the lower resistance of the embodiment of FIG. 8 (due to the greater surface areas of the top and bottom portions) results in a higher quality factor, which is desirable for high-frequency applications. Thus, the embodiment of FIG. 8 offers the advantage of enhanced capacitance density due to the use of interdigitated opposing electrode stacks, and it also offers the advantage of high quality factor due to the large surface areas of the anode and cathode components.

Figure 9:
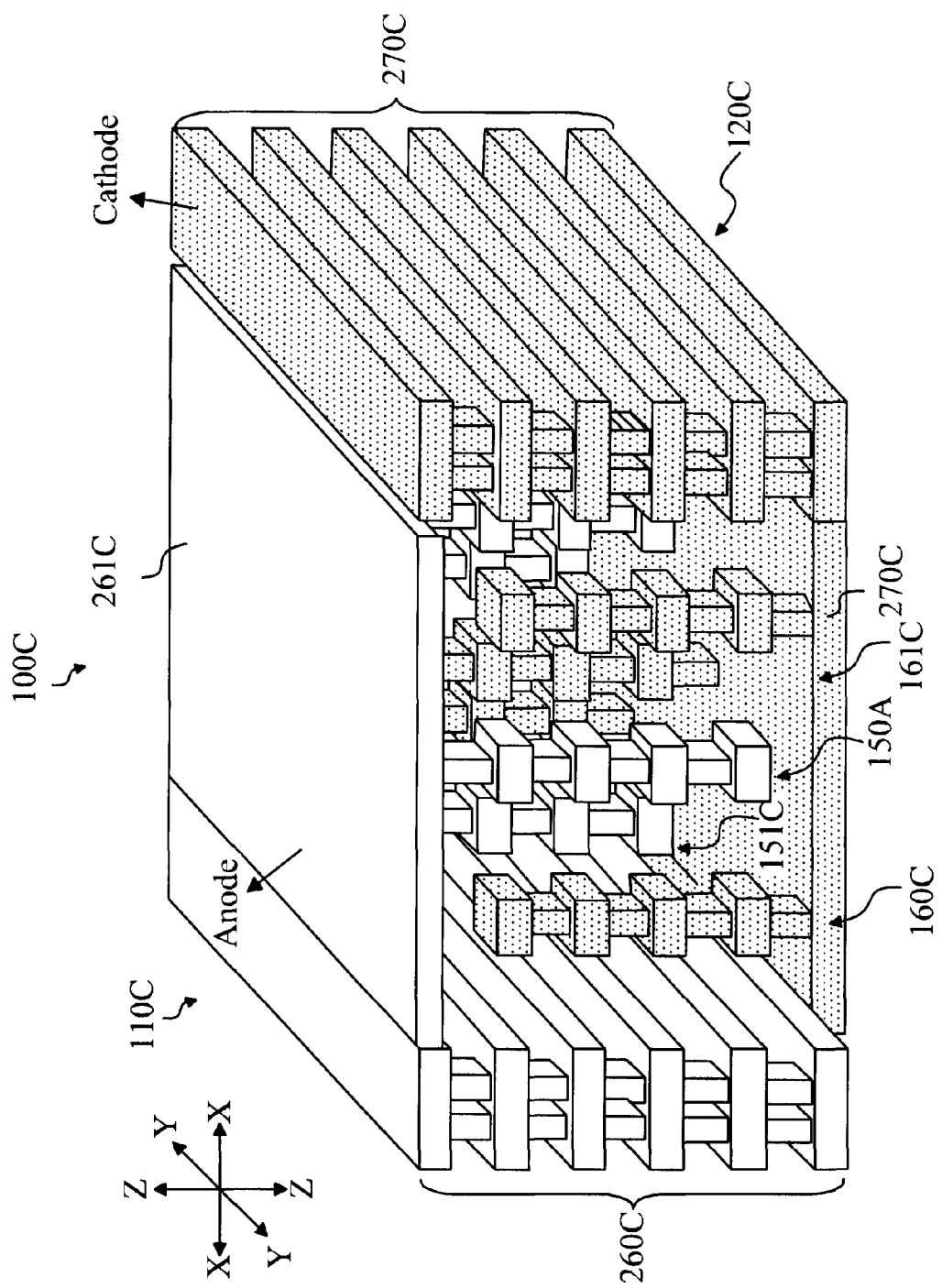

Referring now to FIG. 9, a diagrammatic fragmentary perspective view of another alternative embodiment of the capacitor structure discussed above is illustrated as capacitor structure 100C. The capacitor structure 100C still includes an anode component 110C and a cathode component 120C. The anode and cathode components include arrays of conductive stacks that are disposed in an interdigitated manner with conductive stacks having opposite polarities. The capacitor structure 100C also includes the side portions 260C and 270C similar to those shown in FIG. 4, as well as the top and bottom portions 261C and 271C similar to those shown in FIG. 8. Thus, the capacitor structure 100C may be viewed as a combination of the capacitor structure 100A (FIG. 4) and the capacitor structure 100B (FIG. 8). As such, the capacitor structure 100C offers the advantage of enhanced capacitance density, as well as the advantage of a high quality factor that is conducive for high frequency applications.

Figure 10:
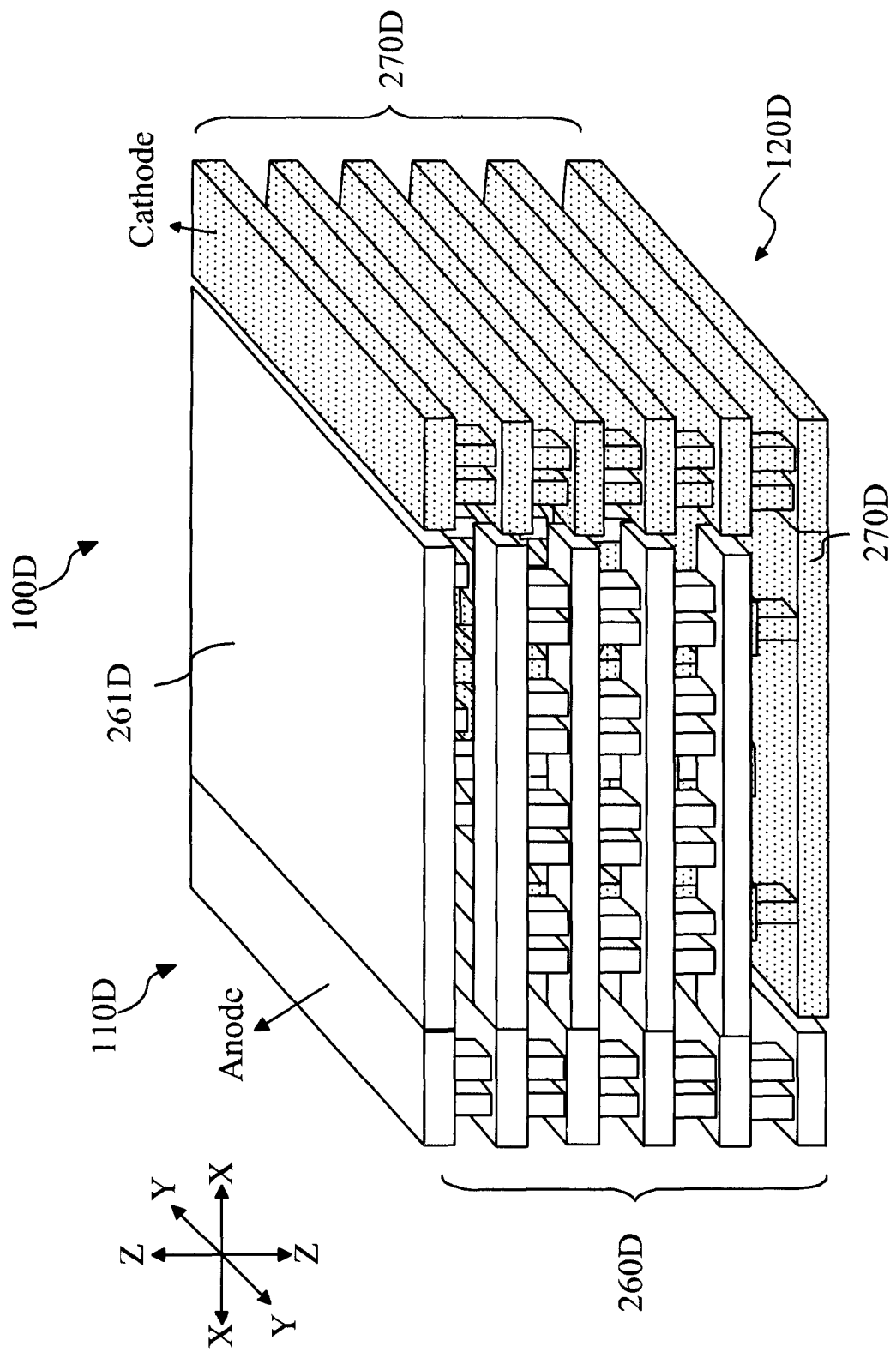

Referring now to FIG. 10, a diagrammatic fragmentary perspective view of yet another alternative embodiment of the capacitor structure discussed above is illustrated as capacitor structure 100D. The capacitor structure 100C includes an anode component 110D and a cathode component 120D. The anode and cathode components include arrays of conductive stacks that are disposed in an interdigitated manner with conductive stacks having opposite polarities. The capacitor structure 100D also includes side portions 260D and 270D for the anode and cathode components 110D and 120D, respectively. Unlike previous embodiments, the side portions 260D and 270D surround the conductive stacks in both the X and Y directions. In other words, the conductive stacks are surrounded by the side portions 260D and 270B horizontally. In addition, the top and bottom portions 261D and 271D cover the conductive stacks from the top and from the bottom. In this manner, the side portions 260D, 270D, and the top and bottom portions 261D and 271D completely surround the conductive stacks and therefore provide complete shielding of the conductive stacks.

Figure 11:
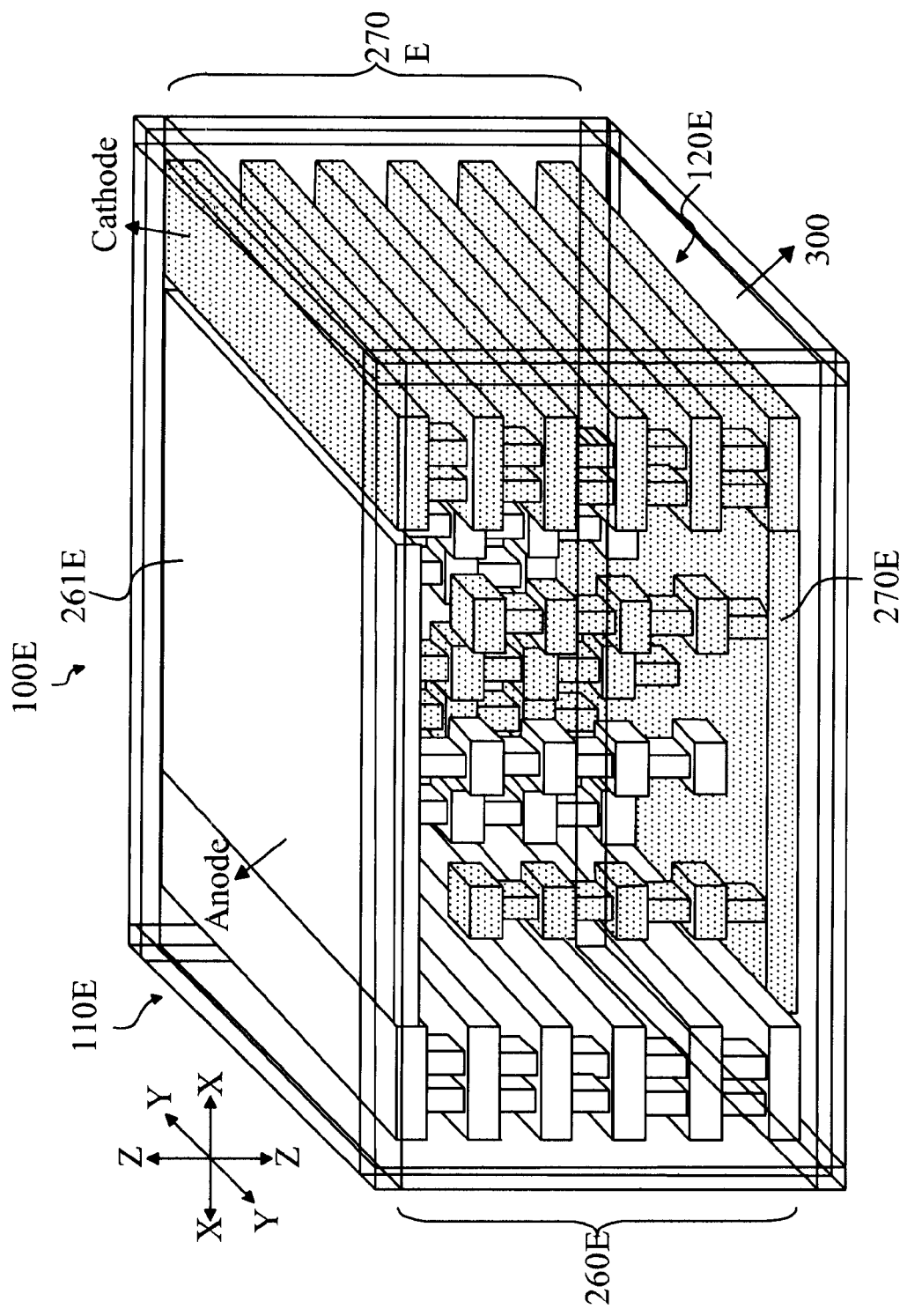

Referring now to FIG. 11, a diagrammatic fragmentary perspective view of yet another alternative embodiment of the capacitor structure discussed above is illustrated as capacitor structure 100E. The capacitor structure 100E is similar to the capacitor structure 100A, 100B, 100C, 100D discussed above and illustrated in FIGS. 4 and 8-10. In addition, the capacitor structure 100E includes a ground shielding structure 300 that shields the anode component 110E and the cathode component 120E. In an embodiment, the ground shielding structure 300 provides complete shielding for the anode component 110E and the cathode component 120E. Such complete shielding gives the capacitor structure 100E immunity (for example, immunity from noise) from its surroundings such as dummy metal or interconnect routing lines.

Figure 12:
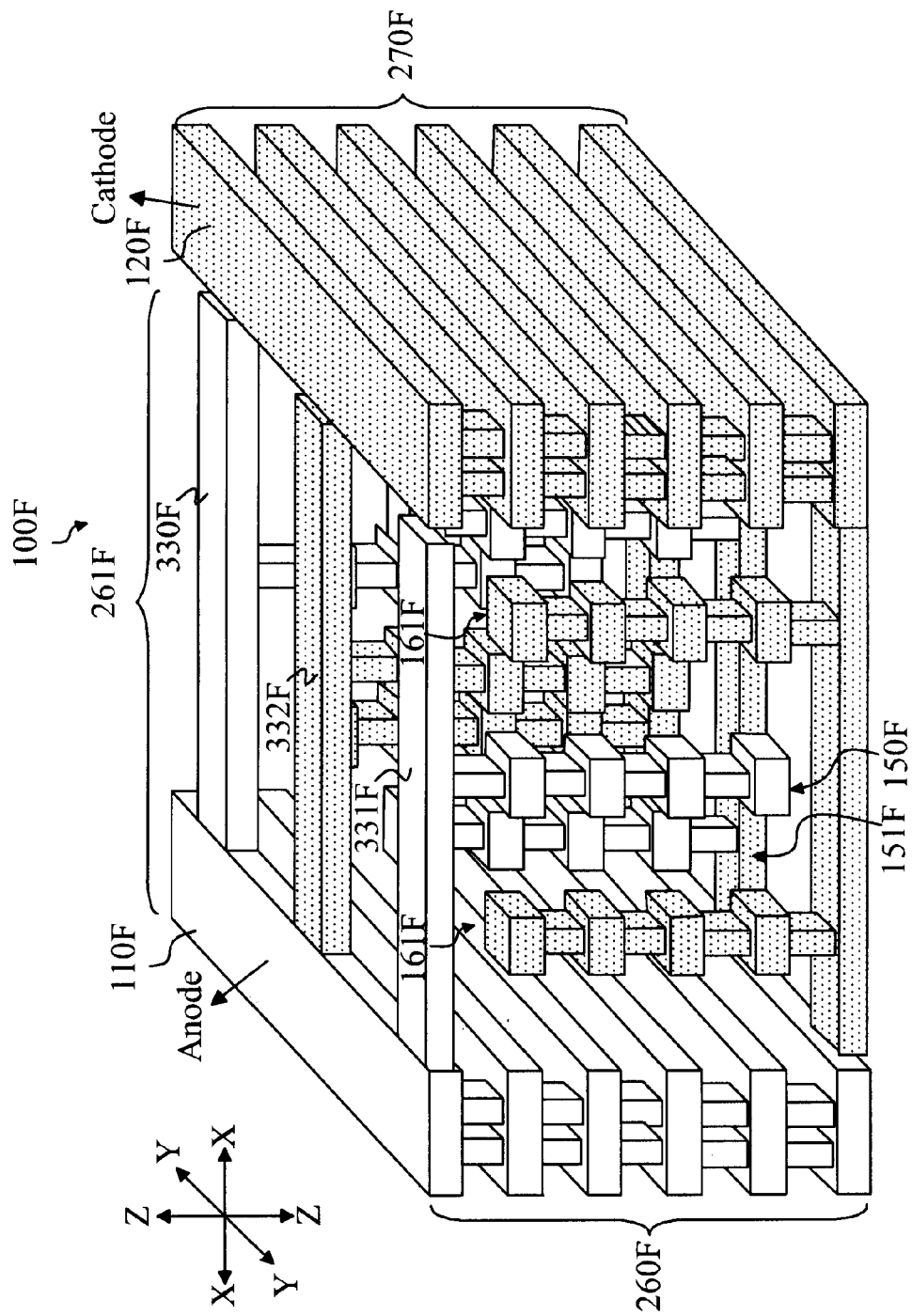

Referring now to FIG. 12, a diagrammatic fragmentary perspective view of one more alternative embodiment of the capacitor structure discussed above is illustrated as capacitor structure 100F. The capacitor structure 100F is similar to the capacitor structure 100A discussed above and illustrated in FIG. 4. Unlike the capacitor structure 100A, however, connection members 330E-331F for the anode component 110F are interdigitated with connection member 332F for the cathode component 120F. This interdigitated nature of the connection members 330E-332F also results in capacitance density increase, which is desirable.

It is understood that additional processes may be performed to complete the fabrication of the capacitor structure. For example, these additional processes may include deposition of passivation layers, packaging, and testing. For the sake of simplicity, these additional processes are not described herein.

A semiconductor device is disclosed according to one of the broader forms of the present disclosure. In one embodiment, the semiconductor device includes: a substrate having a surface that is defined by a first axis and a second axis that is perpendicular to the first axis; and a capacitor disposed over the surface of the substrate, the capacitor having an anode component that includes a plurality of first conductive stacks and a cathode component that includes a plurality of second conductive stacks; wherein: the first conductive stacks and the second conductive stacks each extend along a third axis that is perpendicular to the surface of the substrate; and the first conductive stacks are interdigitated with the second conductive stacks along both the first axis and the second axis.

In an embodiment, the first and second conductive stacks each include a plurality of metal lines interconnected along the third axis by a plurality of vias.

In an embodiment, an interconnect structure having a plurality of interconnect layers is disposed over the substrate, wherein the metal lines each belong to a respective interconnect layer of the interconnect structure.

In an embodiment, the metal lines each have greater dimensions along the first and second axes than the vias.

In an embodiment, the first conductive stacks and the second conductive stacks form a two-dimension array in a top view, wherein the array contains a subset of first and second conductive stacks aligned along the first axis and another subset of first and second conductive stacks aligned along the second axis.

In an embodiment, one of the anode and cathode components further includes a top portion, and the other one of the anode and cathode components further includes a bottom portion, wherein the first and second conductive stacks are disposed in between the top portion and the bottom portion.

In an embodiment, the top portion and the bottom portion each include a respective conductive element that belongs to a metal layer of an interconnect structure.

In an embodiment, the conductive element includes a single metal plate.

In an embodiment, the conductive element includes a plurality of elongate metal lines each extending along one of: the first axis and the second axis.

In an embodiment, the anode and cathode components each include a side portion that contains a plurality of elongate metal lines interconnected along the third axis by a plurality of vias, and wherein the elongate metal lines each extend along one of: the first axis and the second axis.

In an embodiment, the side portions of the anode and cathode components completely surround the plurality of first conductive stacks and the plurality of second conductive stacks along both the first axis and the second axis.

A semiconductor device is disclosed according to one of the broader forms of the present disclosure. In one embodiment, the semiconductor device includes: a substrate that spans in an X-direction and a Y-direction that is orthogonal to the X-direction; and an interconnect structure formed over the substrate in a Z-direction that is orthogonal to both the X-direction and the Y-direction, the interconnect structure including a plurality of metal lines interconnected together in the Z-direction by a plurality of vias, the interconnect structure containing a capacitor that includes an anode component and a cathode component; wherein: the anode component includes an array of elongate anode stack elements extending in the Z-direction; the cathode component includes an array of elongate cathode stack elements extending in the Z-direction; and the array of anode stack elements are interdigitated with the array of cathode stack elements in both the X direction and the Y direction.

In an embodiment, the array of anode stack elements are interdigitated with the array of cathode stack elements in a manner such that the stack elements that are disposed immediately adjacent to one another are of oppositely polarities.

In an embodiment, the anode stack elements and the cathode stack elements each contain a respective subset of the metal lines and a respective subset of the vias, and wherein a cross-sectional profile of each of the anode and cathode stack elements has a zig-zag shape.

In an embodiment, the anode component and the cathode component each include a side portion that contains a respective subset of the metal lines that are interconnected together by a respective subset of the vias, and wherein the metal lines each have an elongate shape and each extend in one of: the X-direction and the Y-direction.

In an embodiment, the anode component and the cathode component each include one of: a top portion and a bottom portion, and wherein the top portion and the bottom portion each include a subset of the metal lines.

In an embodiment, the subset of the metal lines includes one of: a single metal plate, and a plurality of elongate metal lines extending in one of the X and Y directions.

A method of fabricating a semiconductor device is disclosed according to one of the broader forms of the present disclosure. In one embodiment, the method includes: providing a substrate having a surface that is defined by a first axis and a second axis that is perpendicular to the first axis; and forming an interconnect structure over the surface of the substrate, the interconnect structure having a plurality of conductive lines interconnected by a plurality of vias, wherein the forming the interconnect structure includes forming a capacitor with at least some of the conductive lines and at least some of the vias, the capacitor having an anode component that includes a plurality of first conductive elements and a cathode component that includes a plurality of second conductive elements; wherein: the first conductive elements and the second conductive elements each extend along a third axis that is perpendicular to the surface of the substrate; and wherein the first conductive elements are formed to be interdigitated with the second conductive elements along both the first axis and the second axis.

In an embodiment, the forming the capacitor is carried out in a manner such that each of the first and second conductive elements is disposed immediately adjacent to another conductive element of an opposite polarity.

In an embodiment, the forming the capacitor is carried out in a manner such that each of the first and second conductive elements contains a respective subset of the conductive lines and a respective subset of the vias that interconnect the subset of the conductive lines along the third axis.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
a substrate having a surface that is defined by a first axis and a second axis that is perpendicular to the first axis; and
a capacitor disposed over the surface of the substrate, the capacitor having an anode component that includes a plurality of first conductive stacks and a cathode component that includes a plurality of second conductive stacks;
wherein:
the anode and cathode components have different polarities and are configured to receive different voltages;
the first conductive stacks and the second conductive stacks each extend along a third axis that is perpendicular to the surface of the substrate;
the first conductive stacks are interdigitated with the second conductive stacks along both the first axis and the second axis and
the first and second conductive stacks each include a plurality of metal lines interconnected along the third axis by a plurality of vias.

2. The semiconductor device of claim 1, wherein an interconnect structure having a plurality of interconnect layers is disposed over the substrate, and wherein the metal lines each belong to a respective interconnect layer of the interconnect structure.

3. The semiconductor device of claim 1, wherein the metal lines each have greater dimensions along the first and second axes than the vias.

4. The semiconductor device of claim 1, wherein the first conductive stacks and the second conductive stacks form a two-dimension array in a top view, and wherein the array contains a subset of first and second conductive stacks aligned along the first axis and another subset of first and second conductive stacks aligned along the second axis.

5. The semiconductor device of claim 1, wherein one of the anode and cathode components further includes a top portion, and the other one of the anode and cathode components further includes a bottom portion, and wherein the first and second conductive stacks are disposed in between the top portion and the bottom portion.

6. The semiconductor device of claim 5, wherein the top portion and the bottom portion each include a respective conductive element that belongs to a metal layer of an interconnect structure.

7. The semiconductor device of claim 6, wherein the conductive element includes a single metal plate.

8. The semiconductor device of claim 6, wherein the conductive element includes a plurality of elongate metal lines each extending along one of: the first axis and the second axis.

9. The semiconductor device of claim 1, wherein the anode and cathode components each include a side portion that contains a plurality of elongate metal lines interconnected along the third axis by a plurality of vias, and wherein the elongate metal lines each extend along one of: the first axis and the second axis.

10. The semiconductor device of claim 9, wherein the side portions of the anode and cathode components completely surround the plurality of first conductive stacks and the plurality of second conductive stacks along both the first axis and the second axis.

11. The semiconductor device of claim 1, wherein within each of the first conductive stacks and each of the second conductive stacks, the metal lines and the vias are in direct physical contact.

12. A semiconductor device, comprising:
a substrate that spans in an X-direction and a Y-direction that is orthogonal to the X-direction; and
an interconnect structure formed over the substrate in a Z-direction that is orthogonal to both the X-direction and the Y-direction, the interconnect structure including a plurality of metal lines interconnected together in the Z-direction by a plurality of vias, the interconnect structure containing a capacitor that includes an anode component and a cathode component that has an opposite polarity than the anode component;
wherein:
the anode component includes an array of elongate anode stack elements extending in the Z-direction and interconnected by a first subset of the plurality of vias, the anode component having a first voltage;
the cathode component includes an array of elongate cathode stack elements extending in the Z-direction and interconnected by a second subset of the plurality of vias, the cathode component having a second voltage that is different from the first voltage; and
the array of anode stack elements are interdigitated with the array of cathode stack elements in both the X direction and the Y direction.

13. The semiconductor device of claim 12, wherein the array of anode stack elements are interdigitated with the array of cathode stack elements in a manner such that the stack elements that are disposed immediately adjacent to one another are of oppositely polarities.

14. The semiconductor device of claim 12, wherein the anode stack elements and the cathode stack elements each contain a respective subset of the metal lines and a respective subset of the vias, and wherein a cross-sectional profile of each of the anode and cathode stack elements has a zig-zag shape.

15. The semiconductor device of claim 12, wherein the anode component and the cathode component each include a side portion that contains a respective subset of the metal lines that are interconnected together by a respective subset of the vias, and wherein the metal lines each have an elongate shape and each extend in one of: the X-direction and the Y-direction.

16. The semiconductor device of claim 12, wherein the anode component and the cathode component each include one of: a top portion and a bottom portion, and wherein the top portion and the bottom portion each include a subset of the metal lines.

17. The semiconductor device of claim 16, wherein the subset of the metal lines includes one of: a single metal plate, and a plurality of elongate metal lines extending in one of the X and Y directions.

18. A method of fabricating a semiconductor device, comprising:
providing a substrate having a surface that is defined by a first axis and a second axis that is perpendicular to the first axis; and
forming an interconnect structure over the surface of the substrate, the interconnect structure having a plurality of conductive lines interconnected by a plurality of vias, wherein the forming the interconnect structure includes forming a capacitor with at least some of the conductive lines and at least some of the vias, the capacitor having an anode component that includes a plurality of first conductive elements and a cathode component that includes a plurality of second conductive elements;
wherein:
the anode and cathode components have different polarities and are configured to receive different voltages;
the first conductive elements and the second conductive elements each extend along a third axis that is perpendicular to the surface of the substrate;
wherein the first conductive elements are formed to be interdigitated with the second conductive elements along both the first axis and the second axis; and
each of the first and second conductive elements contains a respective subset of the conductive lines and a respective subset of the vias that interconnect the subset of the conductive lines along the third axis.

19. The method of claim 18, wherein the forming the capacitor is carried out in a manner such that each of the first and second conductive elements is disposed immediately adjacent to another conductive element of an opposite polarity.

20. The method of claim 18, wherein the first and second conductive elements are wider than the vias along the first axis and the second axis.

* * * * *